(12) United States Patent
Une

(10) Patent No.: US 6,594,369 B1
(45) Date of Patent: Jul. 15, 2003

(54) ELECTRET CAPACITOR MICROPHONE

(75) Inventor: Hiroshi Une, Kyoto (JP)

(73) Assignee: Kyocera Corporation, Kyoto (JP)

( * ) Notice: Subject to any disclaimer, the term of this patent is extended or adjusted under 35 U.S.C. 154(b) by 174 days.

(21) Appl. No.: 09/637,419

(22) Filed: Aug. 11, 2000

(30) Foreign Application Priority Data

| Aug. 11, 1999 | (JP) | ............................................. 11-227954 |
| Aug. 11, 1999 | (JP) | ............................................. 11-227955 |
| Feb. 28, 2000 | (JP) | ....................................... 2000-052613 |

(51) Int. Cl.[7] ............................................. H04R 25/00
(52) U.S. Cl. ........................................ 381/174; 38/191
(58) Field of Search ................................. 381/174, 191, 381/113, 344, 345, 353, 369, 178, 355, 354, 190

(56) References Cited

U.S. PATENT DOCUMENTS

| 4,012,604 | A | * | 3/1977 | Speidel ......................... 381/174 |
| 4,117,275 | A | * | 9/1978 | Miyanaga et al. ........... 381/174 |
| 4,188,513 | A | * | 2/1980 | Morrell et al. ................ 381/191 |
| 4,392,025 | A | * | 7/1983 | Tamamura et al. .......... 381/174 |
| 4,443,666 | A | * | 4/1984 | Cote ............................. 381/173 |
| 4,453,045 | A | * | 6/1984 | Bruna ........................... 381/174 |
| 4,504,703 | A | * | 3/1985 | Schneiter et al. ............ 381/174 |
| 4,571,464 | A | * | 2/1986 | Segero .......................... 381/174 |
| 5,101,543 | A | * | 4/1992 | Cote et al. .................... 381/191 |
| 5,272,758 | A | * | 12/1993 | Isogami et al. .............. 381/191 |
| 5,335,286 | A | * | 8/1994 | Carlson et al. .............. 381/191 |

\* cited by examiner

Primary Examiner—Rexford Barnie
(74) Attorney, Agent, or Firm—Hogan & Hartson, LLP

(57) ABSTRACT

An electret capacitor microphone is constituted by a surface conductive diaphragm, a fixed electrode provided opposite to the diaphragm at a regular interval and a solid state device for converting, into an electric signal, a voice given to the diaphragm with a change in an electrostatic capacity between the diaphragm and the fixed electrode. The microphone comprises a dielectric casing having a bottomed hollow portion for accommodating the diaphragm, the fixed electrode and the solid state device. Since the casing itself is dielectric, it does not deed to accommodate a special dielectric or a board for the solid state device but can be directly provided in the hollow portion. Therefore, the microphone can be very small-sized and thinned. The hollow portion of the casing has a stepped portion and the diaphragm or the fixed electrode is fixed onto the stepped portion. The hollow portion of the casing has a rectangular cross section and the external shape of the casing is rectangular, the parts can easily be provided in the hollow portion, an unnecessary space can be omitted, and a size can be reduced.

17 Claims, 9 Drawing Sheets

ELECTRET CAPACITOR MICROPHONE

BACKGROUND OF THE INVENTION

1. Field of the Invention

The present invention relates to an electret capacitor microphone.

2. Prior Art

Electret capacitor microphones are often provided with a thin diaphragm having a thin metal film facing toward an opening in a metal casing and a fixed electrode opposed thereto, and utilize the principal of a change in capacity between the diaphragm and the fixed electrode dependently on the vibration of the diaphragm due to a sound wave. The diaphragm utilizes a thin metallized electret material on a surface thereof, and a capacitor is formed between the diaphragm and the fixed electrode. A change in capacity is converted into a current or voltage change through a solid state device, the sound wave being fetched as an electric signal.

Conventional electret capacitor microphones have been provided in a cylindrical metal casing 5 which disposes a diaphragm 4 made of an electret material with a metal layer deposited or other method on the surface and has a sound hole 21 in the central part of an upper surface facing to the diaphragm 4, as shown in FIG. 13. In the casing, a fixed electrode 6 is fixed just behind the diaphragm 4 with a capacitance gap 32 through a thin gap ring spacer 61 between the fixed electrode 6 and the diaphragm 4. Furthermore, a depressed dielectric 27 accommodating a solid state device 8 and a printed circuit board 29 are located in a lower part of the casing 5, and the casing is crimped to a peripheral edge 52 on the back face of the printed circuit board 29, using a crimping portion 52 of the opening of the metal casing 5.

In the conventional example, an input lead 81 of the solid state circuit device 8 is connected to a fixed electrode 26, and an output lead 82 penetrates through the special dielectric 27 and the printed circuit board 29 and is connected to a pad electrode 83 on a bottom face. On the other hand, the diaphragm 4 is conducted to the metal casing 5 through a film ring 41.

Recently, electret capacitor microphones have been required to be light and small-sized. However, in the conventional microphone technique, a large number of parts have been required and the thickness the crimping portion and the pad electrode could not be reduced.

Moreover, in the conventional microphones, since the dielectric and the printed circuit board have been utilized, it has been impossible to satisfy the demand for a reduction in size and weight of the whole microphone.

Conventional electret capacitor microphones are not suitable for mass-production and have had a low productivity. The reason is because parts from the fixed electrode 6 to the printed circuit board 29 are previously assembled as an amplifier block and each part of the assembly is individually disposed in the metal casing 5 and is finally crimped with the crimped portion 52.

In the conventional electret capacitor microphones, since the metal casing is crimped with a substrate, and then the uncertainty of fixation of each part causes microphone failure in use and reduces the yield of the microphone products.

Conventionally, soldering pad electrodes 83, which are takeoff connection portions, have been attached neat a center of the circuit board 29 so that it has been hard to carry out mounting a solid circuit device 8 on the circuit board 29 by soldering the pad electrode 83, and the conventional microphones have had a risk of short-circuiting the circuit board.

A main component of the microphone restricting a reduction in size has been a metal casing 5. A solid circuit device 8 including a transistor or an integrated circuit which normally has a square shape is accommodated on the circuit board with useless space because a conventional metal casing is cylindrical. In addition, the cylindrical metal casing 5 is hard to handle for mounting and to position. Furthermore, even if a sound hole is to have a complicated shape, processing is hard.

The metal casing 5 is apt to transmit a surrounding mechanical vibration, has an adverse influence on the diaphragm and supplies a noise to an electric signal, resulting in a deterioration in microphone performance.

Since the output leads was provided through the printed circuit board, pad electrodes for soldering was required to bury holes through which the leads pass airtightly.

A diaphragm 24 is a membrane of fluoro-polymer membrane such as polyfluoroethylene, polypropylene (FEP), or polyester polymer such as Mylar (registered trademark), and has a thermal resistance limited. Therefore, it has been hard to solder the microphone onto the printed circuit board by heating.

SUMMARY OF THE INVENTION

An object of the present invention is to provide a compact and thin electret capacitor microphone by reducing the number of parts constituting the capacitor microphone as much as possible.

Another object of the present invention is to provide an electret capacitor microphone capable of being assembled with mechanical fixation and electrical connection of parts carried out readily.

Another object of the present invention is to provide an electret capacitor microphone capable of being simply and reliably mounted in a small size onto another printed circuit board.

The elecret capacitor microphone of the present invention includes a casing formed of a dielectric and having a bottomed hollow portion which accommodates a combination of a diaphragm and a fixed electrode apart from each other at regular capacitance interval and a solid state device fox converting, into an electric signal, a change in an electrostatic capacity between a diaphragm and the fixed electrode, thereby forming an electret capacitor microphone.

Electret capacitor microphone will be hereinafter referred to as microphone, simply.

A dielectric casing can directly fix the parts in the hollow portion, eliminating the need for use of a printed circuit board for fixing a special insulator member and solid state circuit according to the conventional example, thereby decreasing the number of parts to be used.

Furthermore, an opening of the casing can be covered with a metal cover having a sound hole to penetrate sound from the outside of the casing to the interior of the hollow and fixed by bonding to the periphery of the opening. As a result, the microphone according to the present invention has a high mass-productivity.

Furthermore, in the microphone of the present invention, the casing may contain the solid state device in parallel to the combination of diaphragm and fixed electrode in its hollow. The combination and the solid state device are arranged laterally so that the whole thickness of the casing is further reduced to make the microphone much thinner.

In the present invention, preferably, the hollow portion of the casing may be divided into two partial hollow portions, in which case the combination of the fixed electrode and the diaphragm may be located in one of the hollow portions and the solid state device is placed in the other hollow portion.

Furthermore, it is preferable that the microphone according to the present invention should have cover for covering the opening of the hollow portion. The cover can also be shared by the fixed electrode, where the cover and the diaphragm are arranged facing to each other to constitute a capacitance gap.

In the present invention, one or more recesses for absorbing a sound preferably may be formed on the bottom of the hollow portion of casing, to eliminate an influence on the diaphragm of a reflected wave to be generated with deduced volume of the hollow portion. The recesses means a depessed portion which is at a lower level than a bottom level of the hollow portion accommodating the solid state device. The vibration of the diaphragm caused by the sound wave makes a wave to the back side toward the hollow bottom. The recess serves to increase a volume under the diaphragm the in the casing to form a release passage for the reflected wave which passage prevents the reflected wave of the diaphragm from interference with the diaphragm, and to compensate for a deterioration in sound-vibration fidelity of the diaphragm.

In the present invention, moreover, the casing can directly apply leads, or interconnections on an outer surface and/or inner surface thereof by utilizing dielectric properties. The dielectric casing may be provided with pad electrode on the outside of the case to be connected to these leads preferably, the pad electrodes can be applied on both sides of the bottom surface of the casing with a simple structure, and then the case can be mounted on other printed circuit boards by soldering the pad electrodes to the corresponding pad electrodes arranged on the circuit board.

In the present invention, furthermore, one or two stepped portions preferably may be provided on the inner wall surface of the hollow portion of the casing to set a diaphragm and a fixed electrode wherein their peripheral edge portions are mounted on the stepped portions. These parts can be conveniently fixed only by bonding such as adhesion or solder bonding, without using other special means for fixing, in the hollow portion, resulting in reduction of the number of the parts.

In the present invention, moreover, it is preferable that the casing, particularly, the hollow portion should have a rectangular cross section. The square shape can be coincident with the external shape of the solid state device or integrated circuit to be accommodated.

Furthermore, the square casing can cause the microphone to be easily handled in a manufacturing process and the completed microphone to be positioned precisely on a wiring board.

BRIEF DESCRIPTION OF THE DRAWINGS

The present invention will be described below in more detail with reference to the accompanying drawings, in which.

PREFERRED EMBODIMENTS OF THE INVENTION

Figure 1A:
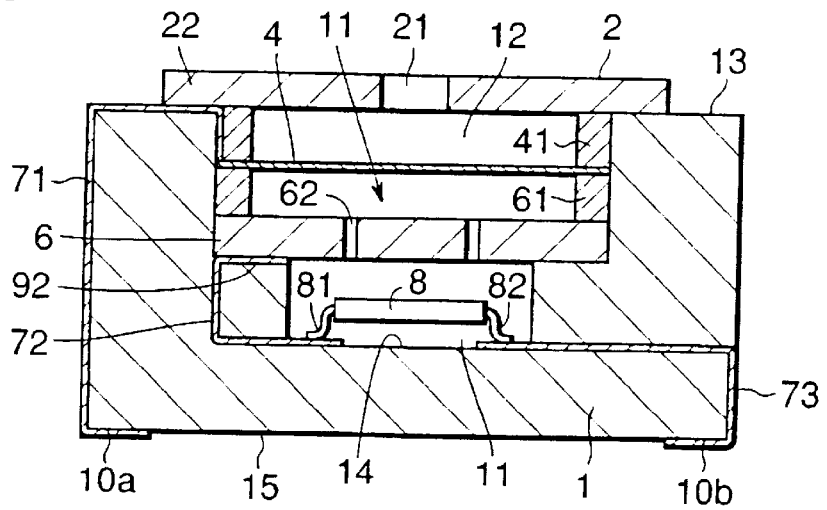
FIG. 1A is a longitudinal sectional view showing a microphone according to an embodiment of the present invention.

A casing to be used for a microphone according to the present invention is formed of a dielectric material. For the dielectric material, ceramics (including glass), polymer or a composite material is used. The casing is formed of the above-mentioned material to be a bottomed hollow member.

Typically, the hollow portion is provided with a diaphragm on the opening side and a fixed electrode therebehind opposite to the diaphragm with a very small gap. The diaphragm is a thin film made of an electret material having a thin metal layer applied to a surface. For the electret material, fluoro-polymer such as FEP and polyester are used. A metal plate is utilized for the other fixed electrodes. The diaphragm and the fixed electrode constitute a capacitor, and a solid state device is connected to the diaphragm and the fixed electrode in order to convert a change in a capacity caused by a sound wave vibration into a change in a voltage or current. A cover is attached to the opening of the hollow portion, and a proper sound hole penetrates through the cover.

In the present invention, the arrangement of the solid state device can have some structures.

First of all, the solid state device is provided on the bottom behind the diaphragm and the fixed electrode in the same hollow portion accommodating the diaphragm and the fixed electrode.

Secondly, the solid state device is provided on the bottom in a transverse direction with respect to the diaphragm and the capacitor of the fixed electrode in the same hollow portion accommodating the diaphragm and the fixed electrode. Consequently, the casing can be thinned through a first structure.

Thirdly, the casing is provided with a separate hollow portion differently from the hollow portion accommodating the diaphragm and the fixed electrode, and the solid state device is provided in the separate hollow portion.

The opening of the hollow portion is covered with a plate-shaped cover. A metal plate having a sound hole 21 in a position opposite to the diaphragm is utilized for the cover.

Preferably, the hollow portion of the casing forms a rectangular cross section. On the other hand, the diaphragm and the fixed electrode may comprise rectangular outer edges such that they are coincident with the hollow portion having a rectangular section. In particular, the solid state device having a rectangular external shape is conveniently accommodated in the bottom portion.

It is preferable that the hollow portion should form a stepped portion to stop and support the diaphragm and/or the fixed electrode on the outer edge. The fixed metal and the diaphragm have such rectangular shapes that peripheral edges can be mounted on the stepped portion. The fixed metal and the diaphragm are provided apart from each other with a capacitance gap through a spacer therebetween, thereby forming a capacitor having a small capacity.

The fixed electrode or the diaphragm has a peripheral edge mounted on the upper surface of the stepped portion and is conductively joined and fixed, with proper bonds, to a separate lead on the inner surface in the hollow portion.

First Embodiment

In this example, a solid state device is provided on a bottom below a diaphragm and a fixed electrode in the same hollow portion accommodating the diaphragm and the fixed electrode.

A microphone shown in FIG. 1A utilizes a rectangular box-shaped casing 1, and a hollow portion 11 in the casing 1 has a rectangular section and the opposite side of the bottom is opened. A stepped portion 92 Is formed on the inner surface of the hollow portion 11.

A fixed electrode 6 is mad of a metal with through holes 62 passing therethrough and is mounted on the stepped portion 92 and is fixed thereto, and a diaphragm 4 is mounted with a very small capacitor gap through a ring-shaped dielectric spacer 61 above the fixed electrode 6, thereby constituting a capacitor. A peripheral edge portion 22 is bonded and fixed to an upper surface 13 of the opening of the hollow portion 11 through a ring spacer 41.

Furthermore, a solid state device 8 is located on a bottom 14 in the hollow portion 11 closer to the bottom side than the stepped portion 92. In this example, an input lead 81 and an output lead 82 of the solid state device 8 are directly fixed to conductive paths 72 and 73 applied to the bottom through means such as brazing or conductive adhesion.

The diaphragm 4 and the fixed electrode 6 are connected to the solid state device 8 through the conductive path provided on the inner surface or outer surface of the casing 1. The solid state device a converts a change in a capacity between the diaphragm 4 and the fixed electrode 6 caused by an input sound wave into a change in a voltage and current, and pre-amplifies the same depending on the circumstances. The output of the solid state device 6 is connected to an electronic circuit provided on a separate wiring board.

As an example of the connection, for example, a proper conductive path 72 is provided on the inner surface from the stepped portion 92 to the bottom, and the fixed electrode 6 is mounted on the stepped portion 92 and is joined to the conductive path through bonds. Such a bonding material includes solders, brazes and conductive adhesives.

The casing 1 may have a conductive path 71 provided on the outer surface. The conductive path can utilize a conductive paste layer applied on the casing surface and a through hole filled with a conductive paste. A green sheet including the conductive paste is provided so that a conductive film can be formed on a surface or an inner surface.

Figure 1B:
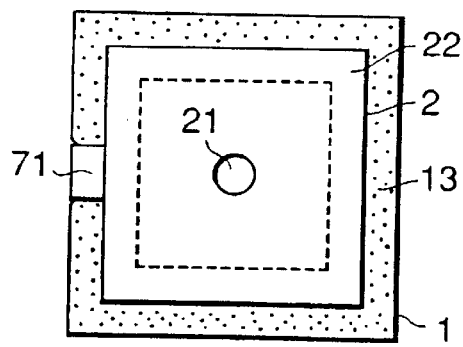
FIG. 1B is a top view showing the microphone illustrated in FIG. 1A.

An example of the conductive path is shown in FIGS. 1A and 1B. In the conductive path connected to the diaphragm, the vibration film 4 comes in contact with the film ring 41, and the film ring 41 is connected to a pad electrode 10a on a bottom surface through the metal film of an opening surface 13 of the opening of the hollow portion 11 and the succeeding conductive path 71 on the outer surface. The opening end face 13 of the casing 1 has a metal film metallized and is also bonded to the metal cover 2 with solders, brazes, conductive adhesives and the like.

For the fixed electrode 6, the conductive path 72 including the stepped portion 92 for stopping the fixed electrode is formed on the inner surface of the hollow portion and is connected to the input terminal 81 of the solid state device 8 in the bottom portion. Furthermore, the conductive path 73 connected to the output terminal 82 of the solid state device is led to the outside of the casing 1 and is connected to another pad electrode 10b.

Figure 1C:
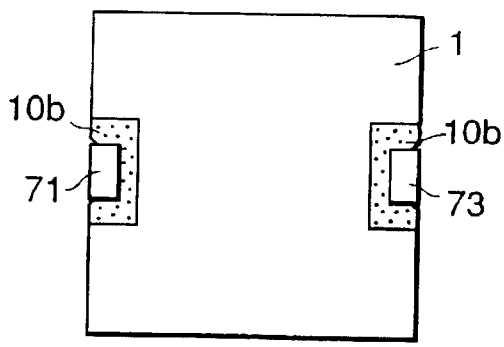
FIG. 1C is a bottom view showing the microphone illustrated in FIG. 1A.

In this example, the pad electrode 10a connected to the diaphragm 4 is grounded, and the conductive path 71 can serve as an electrostatic shield if the outer surface of the casing is covered with a proper area. The other pad electrode 10b is utilized as the output terminal of the solid state device 8 and is also used as a power source at the same time. According to the electret capacitor microphone according to the present embodiment, the pad electrodes 10a and 10b can easily be mounted on a separate printed circuit board on both sides of the bottom surface of the casing 1 as shown in FIG. 1C.

The electret capacitor microphone according to the present invention uses the dielectric casing 1. As compared with a conventional structure shown in FIG. 12, therefore, a printed circuit board 29 mounting a dielectric 27 and an electronic circuit 8 in the metal casing can be eliminated and the number of parts can be decreased, resulting in a reduction in a size.

According to the electret capacitor microphone in accordance with the present invention, furthermore, the elements are inserted and fixed in order from the bottom face side through the opening 12 in the hollow portion 11 of the casing 1, and the opening is finally covered with the cover 2. Consequently, a manufacturing process can be simplified and mass production can be carried out easily. The stepped portion 92 bonds the fixed electrode 6 into the casing 1 and other parts can also be bonded to the casing reliably and easily. Thus, these elements can be fixed strongly.

Furthermore, the casing 1 has the hollow portion taking a rectangular cross section and can easily accept the square-shaped solid state device 8, thereby preventing a spatial waste. Consequently, the size of the whole microphone can be more reduced. In addition, when the microphone is to be mounted on the surface of another wiring board, it can be easily handled because of the square shape and can also be positioned on the wiring board readily.

The dielectric forming the casing 1 can use cerarmics including, as main components, alumina, zirconia, mullite, silicon carbide, silicon nitride, aluminum nitride and the like, and can particularly enhance a periodic dangling characteristic. The reason is that these ceramics have greater vibration damping capacities as compared with a metallic material. A ceramic casing is particularly used for a portable telephone or the like, and can transmit an external vibration to the inside with difficulty and can enhance the signal-to-noise characteristic of the microphone.

Figure 1D:
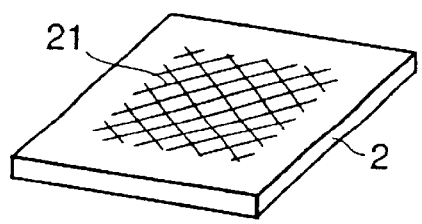
FIG. 1D is a perspective view showing a cover according to another embodiment.

In the present invention, furthermore, the rectangular casing 1 can allow for the plate-shaped cover 2 and can easily process the cover. Therefore, it is also use a structure in which a mesh-shaped sound hole 21 is provided as shown in FIG. 1D, for example. The sound hole 21 is usually covered with a plane cloth (not shown) to prevent foreign substances from entering. Thus, the mesh-shaped sound hold 21 can omit the plane cloth.

Figure 1E:
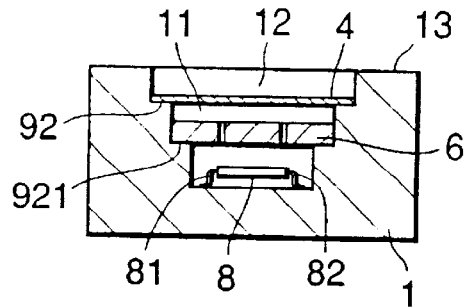
FIG. 1E is a longitudinal cross-sectional view showing a microphone according to an embodiment of the present invention.

As another embodiment, preferably, two stepped portions 92 may be formed on the casing 1, one of them fixing the diaphragm 4 and the other fixing the fixed electrode 6 as shown in FIG. 1E. The two steps have an advantage that the film ring 3 and the gap spacer 61 can be omitted.

Second Embodiment

Second Embodiment

Figure 2:
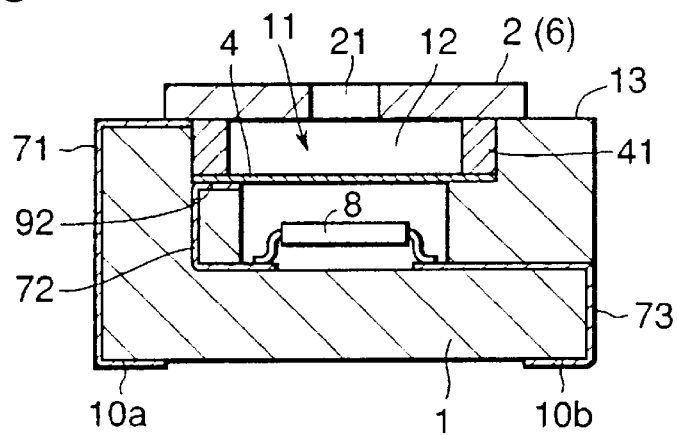
FIG. 2 is a longitudinal sectional view showing the microphone according to an embodiment of the present invention in which a cover is also used as a fixed electrode.

In the present embodiment, a fixed electrode is also used as a cover. In the example shown in FIG. 2, an opening 12 of a casing 1 is covered with a metal cover 2 having a sound hole fixed to an upper surface 13, and the back side of the cover is provided with a diaphragm 4 through a dielectric gap spacer 41. The diaphragm 4 is fixed to a stepped portion 92 in a hollow portion. The cover 2 is connected to a pad electrode 10a through a conductive path 71 provided on an outer surface, and the diaphragm 4 is connected to a pad electrode 10b through a conductive path 72, a solid state device 8 and a conductive path 73 as described above.

In the present embodiment, the cover 2 is also used as the fixed electrode 6 to detect a change in an electrostatic capacity between the cover 2 (fixed electrode 6) and the diaphragm 4. Consequently, the number of parts can be more decreased and a size can be more reduced as compared with those in FIG. 1.

Next, the structure of attachment of the solid state device 8 will be described. In the above-mentioned example, an input lead 81 and an output lead 82 of the solid state device 8 are mounted on the conductive paths 72 and 73 respectively, and are bonded with solders, brazes, conductive adhesives or the like.

Figure 3A:
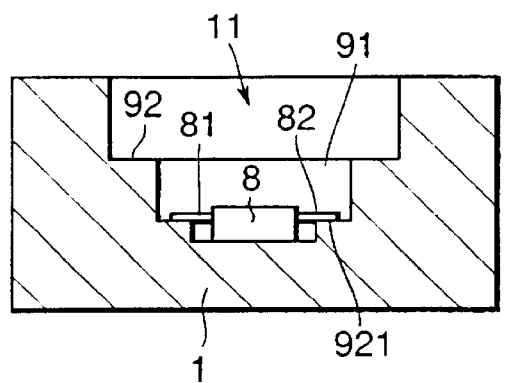
FIGS. 3A to 3C are sectional views showing a casing for the fixation of a solid state device in the casing according to an embodiment of the present invention.
Figure 3B:
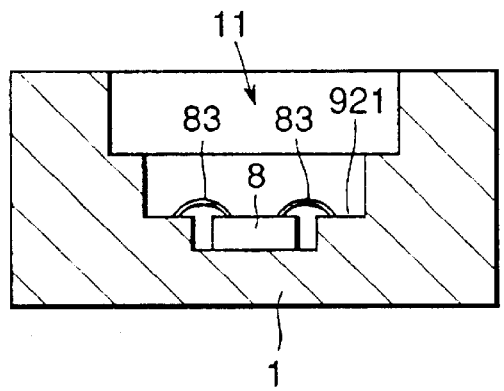
Figure 3C:
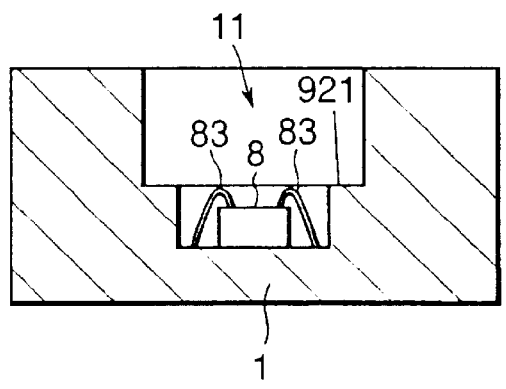

As shown in FIG. 3A, two stepped portions 92 and 921 may be provided on the inside of the box-shaped casing 1, and the input lead 81 and the output lead 82 of the solid state device 8 may be mounted on the stepped portion 92b and may be bonded to the conductive path. Alternatively, the solid state device 8 having no lead may be provided and may be connected to a conductive path (not shown) through a wire bonding 83 as shown in FIGS. 3B and 3C.

Figure 4A:
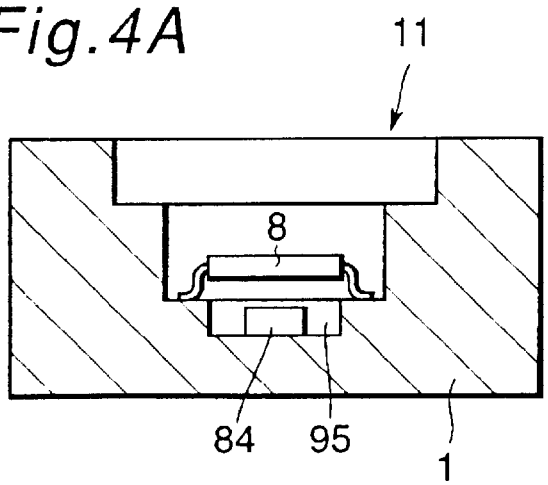
FIGS. 4A and 4B are sectional views showing the casing for the fixation of the solid state device in the casing according to an embodiment of the present invention.
Figure 4B:
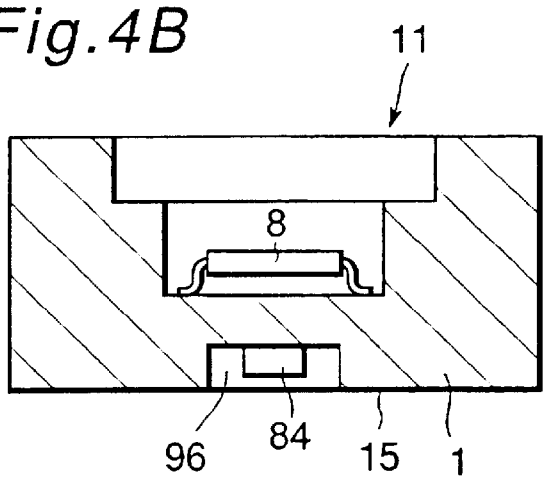

In the present invention, furthermore, the dielectric casing 1 is used. Therefore, it can also be possible to easily mount other electronic parts. As shown in FIG. 4A, for example, another stepped portion 95 may be formed below the solid state device 8 and another electronic part 84 may be provided therein or a concave portion 96 may be formed in an outer bottom portion 15 of the casing 1 and the electronic part 84 may be provided therein.

Figure 5:
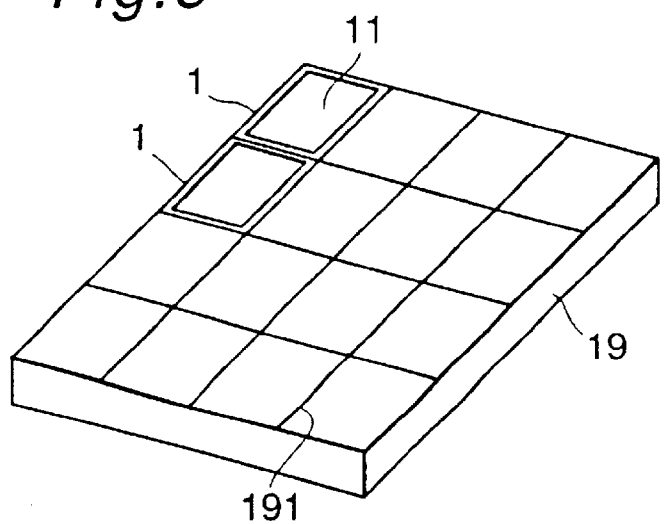
FIG. 5 is a perspective view showing a ceramic substrate for dicing a large number of casings.

In a process of manufacturing an electret capacitor microphone according to the present invention, moreover, the microphone can be mass-produced by using many fetching methods. For example, as shown in FIG. 5, a large number of hollow portions 11 are formed on a board 19 made of a dielectric such as ceramics or glass, and dicing is carried out along scribing lines 191. Consequently, each casing 1 can be obtained. Alternatively, each part may be accommodated in each hollow portion 11 before the dicing and the electret capacitor microphone may be fabricated, and the dicing operation can be then carried out along the scribing lines 191. The dicing operation along the scribing lines 191 is carried out by cutting through a scribing trench formed on the board 19 in advance or cutting using a diamond cutter, a laser beam or the like. By using such a method, a large number of microphones can be produced collectively.

Third Embodiment

Figure 6A:
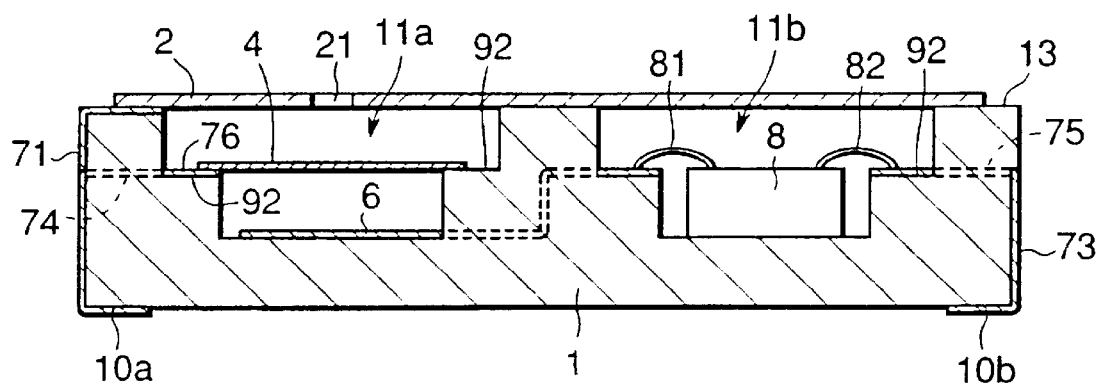
FIG. 6A is a longitudinal sectional view showing a microphone in which two hollow portions are provided and a capacitor portion and a solid state device are arranged thereon in parallel according to the embodiment of the present invention.

FIG. 6A shows a microphone comprising two independent and adjacent hollow portions 11a and 11b separated though partition walls in a casing 1 made of a dielectric. The combination of a diaphragm 4 and a fixed electrode 6 is provided in the hollow portion 11a and a solid state device 8 is provided in the hollow portion 11b. In this example, both hollow portions 11a and 11b are covered with one plate-shaped cover 2.

In the hollow portion 11, the fixed electrode 6 is provided on a bottom face, a stepped portion 92 is formed, and a diaphragm 4 is provided on the upper surface of the stepped portion through a capacitance gap with respect to the fixed electrode 6. A thin film made of an electret material having a metal layer formed thereon is utilized for the diaphragm 4. The solid state device 8 is directly bonded to the bond face in the hollow portion 11b. An amplifier circuit or the like is formed on the solid state device 8.

The cover 2 serves to close the two hollow portions 11a and 11b and a sound hole 21 is opened in a portion corresponding to the hollow portion 11a.

In this example, the diaphragm 4 is bonded onto a conductive path 74 formed in the stepped portion, the conductive path is connected to a conductive path 71 on the outer surface of the casing via a through hole 74, and is connected to a pad electrode 10a on the bottom face.

The conductive path 71 is provided to cover a large portion of the outer surface of the casing and is grounded. Therefore, it is possible to carry out a shield against a high frequency wave or an electrostatic shield.

Moreover, the fixed electrode 6 is conducted to the conductive path 72 arid is connected to an input terminal 81 of the solid state device 8, and a conductive path 75 connected to an output terminal 82 is led to an external conductive path 73 of the casing 1 and is connected to another pad electrode 10*b*. The input terminal 81 and the output terminal 82 of the solid state device 8 are subjected to wire bonding between the conductive paths 72 and 75 provided in the stepped portion 92*b* of the hollow portion 11*b*, respectively.

Figure 6B:
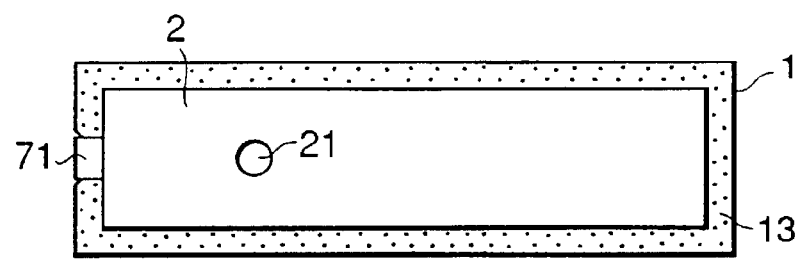
FIGS. 6B and 6C show a top view and a bottom view, respectively, of the microphone illustrated in FIG. 6A.
Figure 6C:
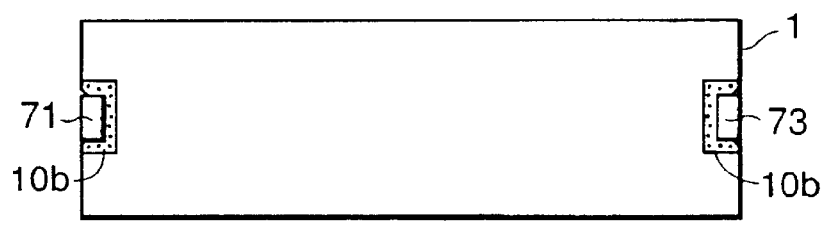

FIG. 6C shows the arrangement of the pad electrodes 10*a* and 10*b* on both sides of the bottom face of the casing 1. It is also possible to easily carry out mounting on other wiring boards and connection to a connecting pad electrode on the board side.

As shown in FIG. 6B, an upper end face 13 of the casing 1 is metallized and is connected to the conductive path 71 on the external surface and is conductively bonded to the metal cover 2 with conductive adhesives or the like. Consequently, the cover 2 has the same potential as that of the conductive path 71, that is, an earth potential.

Thus, the diaphragm 4 and fixed electrode 6 and the solid state device 8 are accommodated in parallel. Consequently, a thickness can be reduced. In the present embodiment, furthermore, there is an advantage that the solid state device 8 can be accommodated in the independent hollow portion 11*b* and can be sealed airtightly with the cover.

Furthermore, the hollow portion has a square shape seen in a plane and the casing 1 has a polygonal shape as a whole. The hollow portion has such an advantage that a spatial waste is not caused and the whole size can be more reduced when the polygonal solid state device 8 is accommodated therein. In addition, when the microphone is to be mounted on a surface, the polygonal shape can give easy handling and simple positioning.

Figure 7:
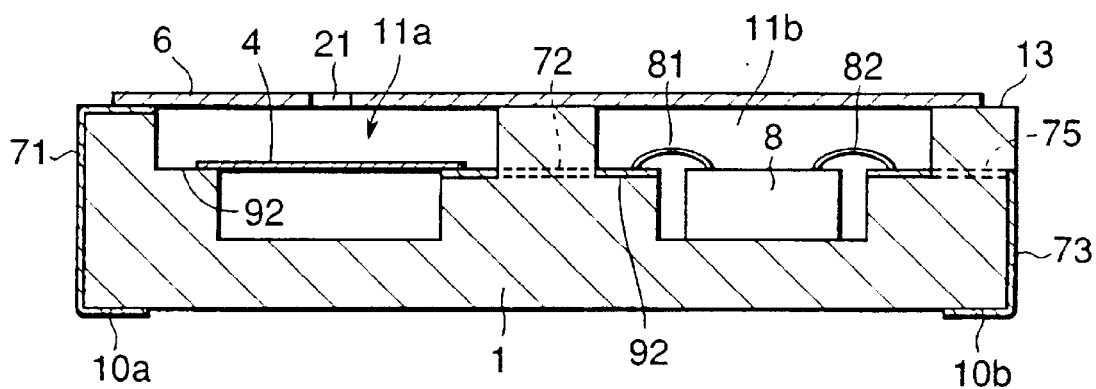
FIG. 7 is a longitudinal sectional view showing the microphone according to the embodiment illustrated in FIG. 6, in which a cover is also used as a fixed electrode.

FIG. 7 shows another variant in which the fixed electrode 6 is also used as the cover 2. Two hollow portions 11*a* and 11*b* are formed in the casing 1 through a partition wall. A diaphragm 4 is provided in a stepped portion 92 of the hollow portion 11*a* in the casing 1. The diaphragm 4 is connected to a pad electrode 10*a* through a conductive path 72 and a solid state device 8 is accommodated in the hollow portion 11*b*, and the solid state device is connected to a pad electrode 10*b* through conductive paths 75 and 73. Moreover, the cover 2 is bonded to the upper surface of an opening to cover the diaphragm, and the cover is connected to the pad electrode 10*a* through a conductive path 71 such that it can be utilized together with the fixed electrode 6 for the diaphragm 4.

Fourth Embodiment

Figure 8:
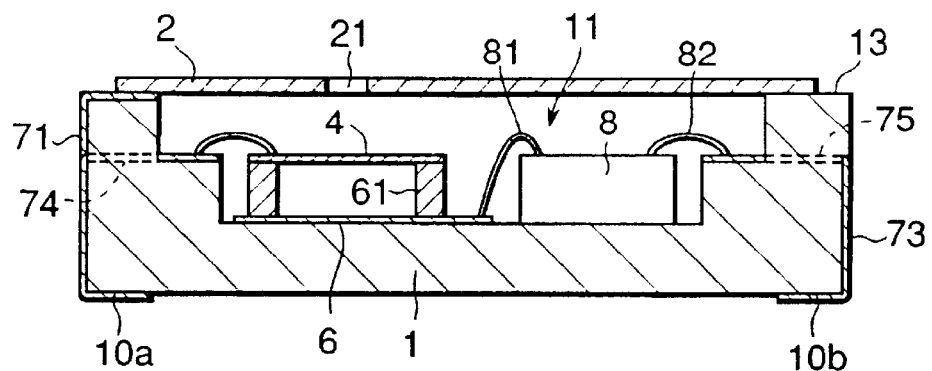
FIG. 8 is similar to FIG. 6A, in which a capacitor portion and a solid state device are provided in parallel in a single hollow portion according to the embodiment of the present invention;.

As another embodiment, in the embodiment shown in FIG. 8, one hollow portion 11 accepts the combination of a fixed electrode 6 and a diaphragm 4 and a solid state device 8 provided at the side thereof. In this example, the fixed electrode 6 is applied to the bottom surface of the hollow portion 11 of the casing 1, and the diaphragm 4 is provided with a capacitor gap through a gap spacer 61. The diaphragm bonds a conductive path 75 provided in a stepped portion 92 to a wire and is connected to a pad electrode 10*a* through a conductive path 71. Moreover, the cover 2 is also connected to the conductive path 71. On the other hand, the solid state device 8 is provided on the bottom face of the hollow portion 11 in parallel with the fixed electrode, and an input terminal 81 of the solid state device 8 is wire bonded to the fixed electrode 6, an output terminal 82 is wire bonded to the conductive path 75 in the stepped portion 92, and the conductive path 75 is connected to the other pad electrode 10*b* through a conductive path 73.

With this structure, one hollow portion 11 is formed in the casing and parts can be provided transversely. Therefore, the casing can have a simple shape and manufacture can easily be carried out.

Figure 9:
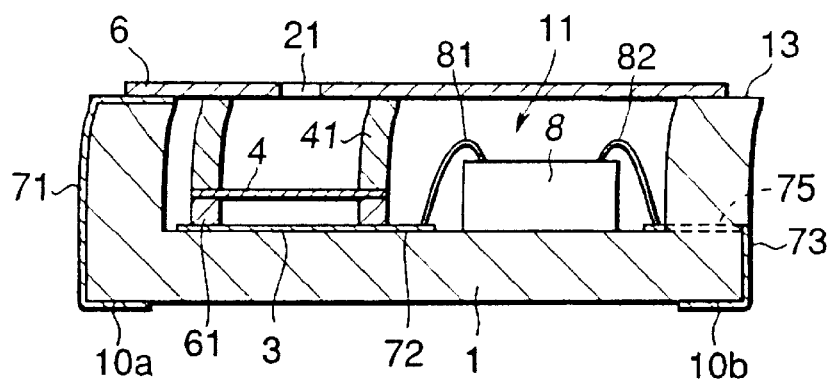
FIG. 9 is similar to FIG. 7, in which a cover is also used as a fixed electrode in the microphone illustrated in FIG. 8.

FIG. 9 shows another variant in which a fixed electrode 6 is also used as a cover 2 by using a further hollow portion. A diaphragm 4 is provided through the gap spacer 61 below the cover 2 covering an upper surface 13 of a casing 1, and is electrically connected to a pad electrode 10*b* through a conductive path 72, a solid state device 8 and conductive paths 75 and 73 via a film ring 3. Moreover, the cover 2 which is also used as the fixed electrode is connected to another pad electrode 10*a* through the conductive path 71.

While a conventional electret capacitor microphone should require a thickness of approximately 2 mm, the electret capacitor microphone according to the present invention described above can have a thickness of 1 mm or less, preferably 0.5 mm or less.

Fifth Embodiment

In the present embodiment, a microphone is provided with a recess on the internal wall of a hollow portion of a casing. A stepped portion for fixing a diaphragm and a fixed electrode in the hollow portion is provided in the hollow portion, and a solid state device is fixed to the bottom or the hollow portion. With such a structure, the recess is positioned behind the diaphragm. The vibration of the diaphragm caused by an input sound wave generates sound wave vibration on the back side. However, the recess increases a blank volume on the rear side to absorb or damp a sound wave into the back side, thereby preventing the interference of the sound wave on the back side with the diaphragm and a deterioration in fidelity due to the interference of the diaphragm. The recess may be formed in any portion of the inner surface of the hollow portion on the rear side of the diaphragm, preferably, in the bottom on the inside.

Figure 10A:
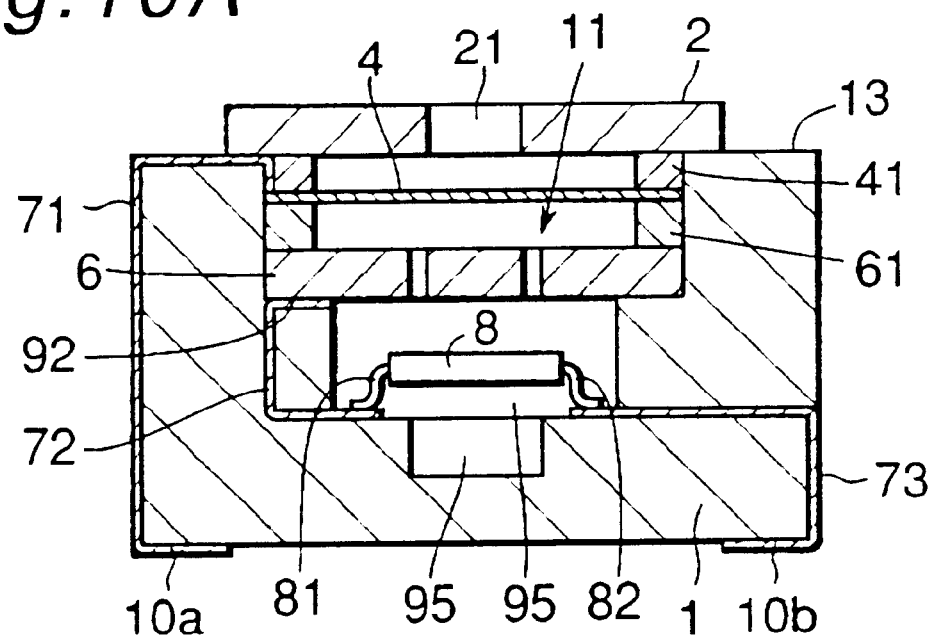
FIG. 10A is the same as FIG. 1A illustrating the embodiment in which a concave portion is formed on the bottom of the hollow portion of the casing.
Figure 10B:
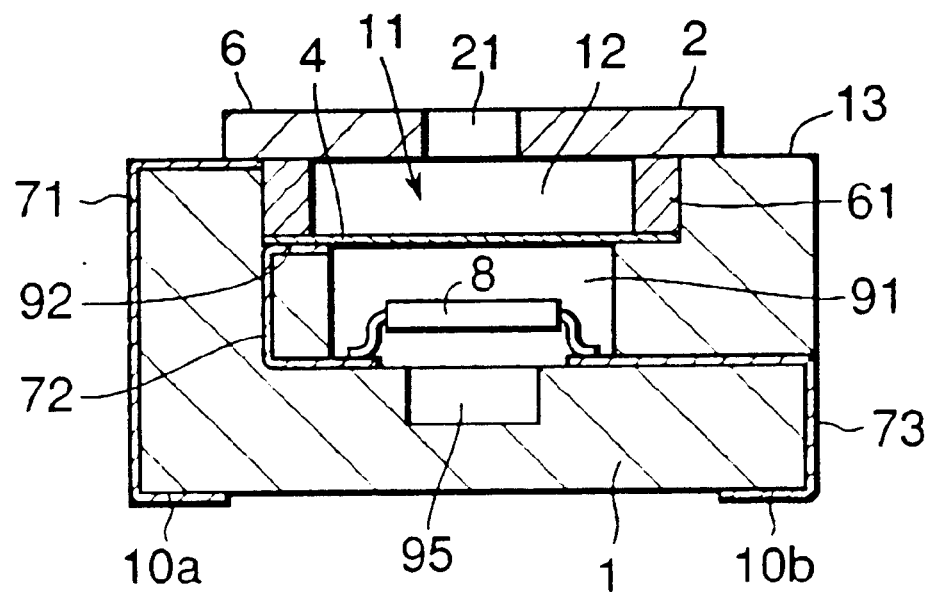
FIG. 10B is the same as FIG. 1E illustrating the embodiment in which a concave portion is formed on the bottom of the hollow portion.

The microphone of this type comprises a stepped portion 92 on the internal wall of a hollow portion 11 of a casing 1 formed of a dielectric and a recess 12 is provided in the bottom on the inside as shown in FIGS. 10A and 10B. In the example of FIG. 10A, a solid state device 8 is fixed to the bottom portion, a fixed electrode 6 is provided in the stepped portion 92, a diaphragm 4 is provided above the fixed electrode through a ring-shaped spacer 61 forming a capacitor gap, and a cover 2 through which a sound hole 21 penetrates is bonded to an opening.

FIG. 10B shows a variant of a microphone in which a fixed electrode 6 provided with a recess 12 is also used as a cover 2. A casing forms a stepped portion 92 supporting a diaphragm in a hollow portion, and a recess is similarly formed as a concave part in the bottom portion. An upper end face 13 of a casing 1 is covered with a cover 2 which is also used as the fixed electrode 6, and a diaphragm 4 is fixed to the stepped portion 92 below the cover 2 through a spacer 61 forming a capacitor gap so that a capacitor is formed by the diaphragm 4 and the cover 2. A solid state device 8 is fixed to the bottom portion. A recess 12 is further provided in the bottom portion to damp a sound wave on the back side through the diaphragm 4 and to prevent a deterioration in characteristics.

Figure 11A:
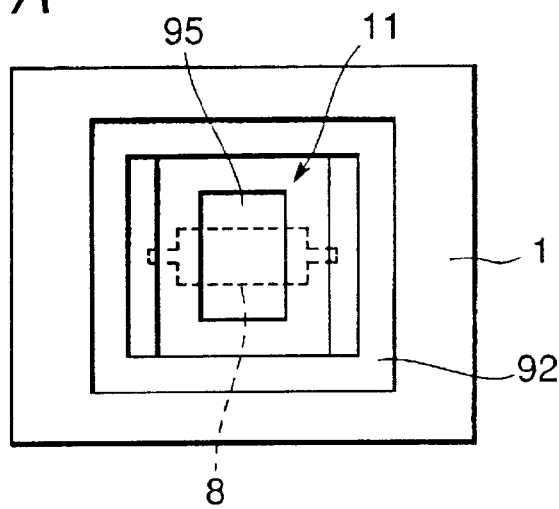
FIGS. 11A to 11C are top views showing the casing in which the concave portion is formed on the bottom of the hollow portion.
Figure 11B:
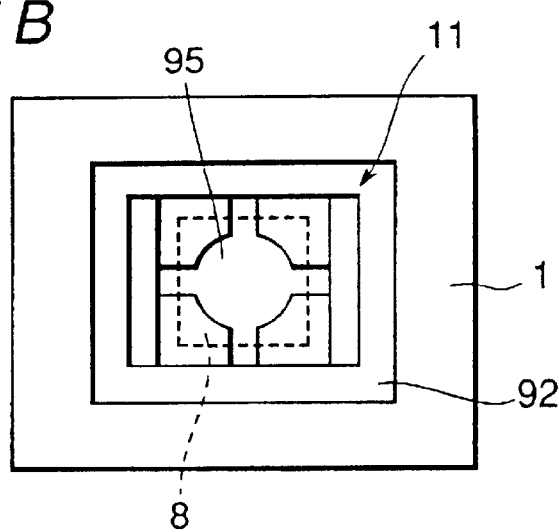
Figure 11C:
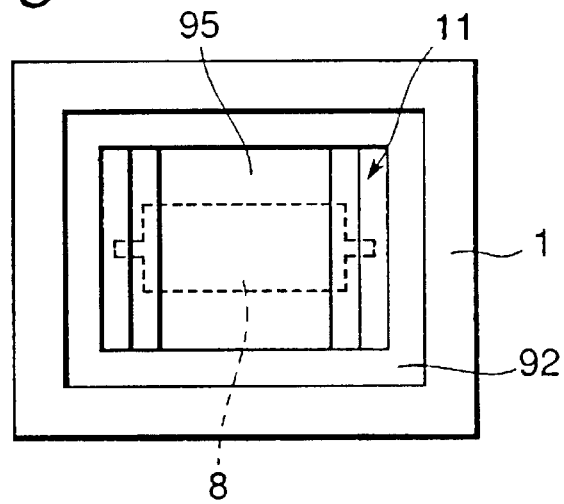

FIGS. 11A to 11C show various examples of the planar shape of the recess 12. The recess 12 can be formed to have a rectangular shape on the bottom face of a hollow portion 11 (FIG. 11A) and can be formed circularly (FIG. 11B). Furthermore, a part of the side surface of the recess may be on the level with the internal wall of the hollow portion (FIG. 11C). In any case, the recess 12 is not completely covered with the solid state device 8 but is formed spatially continuously with the hollow portion 11. Moreover, the recess 12 may be provided in any of the wall surfaces of the hollow portion 11 and is preferably formed on a bottom face opposed to the diaphragm 4.

Moreover, the recess 12 is provided. Consequently, when the solid state device 8 is to be joined through solders, brazes, conductive adhesives or the like, these can act as an antirunning material and can also contribute to a reduction in a whole weight. Alternatively, other electronic parts can be mounted on the recess 12. In respect of the strength of the casing 1, a portion of the casing where the recess 12 is formed requires a thickness of 0.1 mm or more.

Figure 12A:
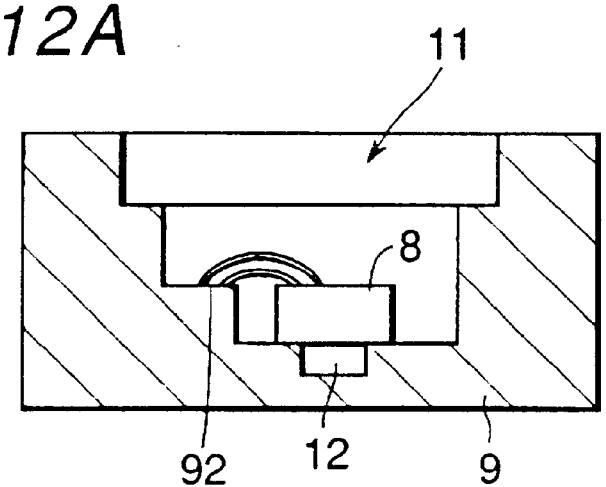
FIG. 12A is a sectional view showing a casing according to another embodiment in which a concave portion is formed in the hollow portion of a casing.
Figure 12B:
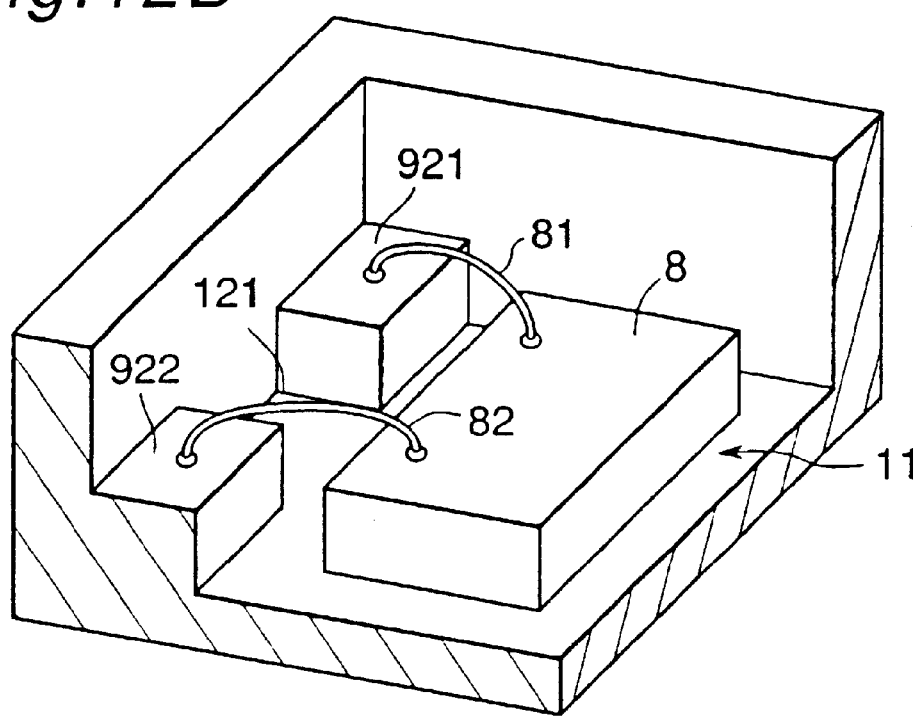
FIG. 12B is a partial perspective view showing the inside of the hollow portion of the casing according to the embodiment utilizing a portion between the divided steps as a concave portion.
Figure 13:
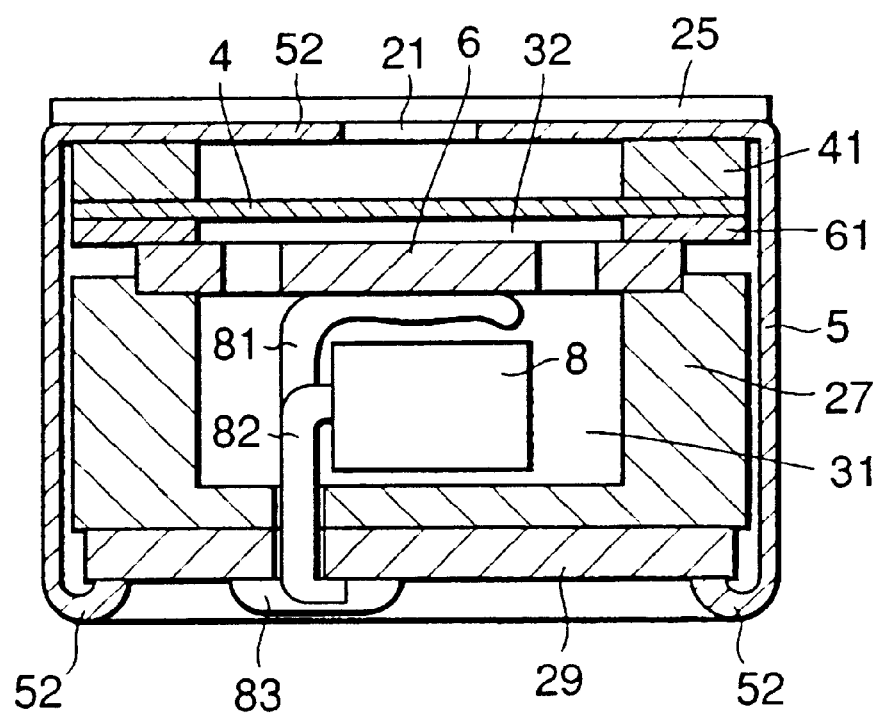
FIG. 13 is a longitudinal sectional view showing a conventional microphone.

As a further embodiment, in FIG. 12A, a stepped portion 92b in the hollow portion of the casing 1 is formed only one of sides. Consequently, the volume of the hollow portion 11 is increased. Moreover, the stepped portion 92 is divided into two stepped portions 921 and 922. Consequently, a space 121 between the two stepped portions can be utilized for a recess.

Sixth Embodiment

In the present embodiment, conductive adhesives are utilized for bonding a dielectric casing to a cover. The casing has the fixed electrode and the diaphragm fixed into a hollow portion, and the cover covers the opening of the hollow portion. The cover is bonded to the opening with the conductive adhesives. The conductive adhesives can be used for fixing the cover onto other printed circuit boards, and an electrode leading portion can be connected to the printed circuit board.

Such adhesives are adjusted to be cured at 150° C. or less. The cover is bonded with the conductive adhesive which is cured at a comparatively low temperature so that each member can be fixed strongly by using a diaphragm having a low thermal resistance. In the present invention, similarly, the casing is fixed to the printed circuit board with the conductive adhesive so that surface mounting can easily be carried out with a simple structure by using a diaphragm having a low thermal resistance.

In FIGS. 1A and 1B, a contact portion of an upper end face 13 of a casing 1 and a peripheral edge portion 22 of a cover 2 is bonded with an adhesive of a low temperature curing type.

The conductive adhesive is made of a thermosetting resin and a conductive filler. A fine metal particle, for example, aluminum or silver powder is utilized for the conductive filler, and an epoxy resin is utilized for the thermosetting resin, for example. The thermosetting resin is cured at 150° C. or less, preferably, at an ordinary temperature, and a cured matter preferably has a volume resistivity of $10^{-3}$ to $10^{-5} \Omega/$ cm. A curing temperature is set to 150° C. or less such that the heating during the curing does not exceed the deterioration temperatures of fluoro-polymer and a polyester resin film which are to be used for the diaphragm.

The conductive adhesive gives bonding and conductive properties to the bonding portion of the peripheral edge 22 of the cover 2 and the upper surface 13 of the casing 1. Therefore, a metal cover electrically bonds a metal layer on the upper surface of the casing 2 and a ring film 41 of a diaphragm 4 through a conductive adhesive layer. Consequently, the diaphragm 4 is connected to a conductive path 71 on the outer surface of the casing. The conductive adhesive is usually cured at an almost room temperature.

Therefore, a film material having a low thermal resistance can be used for the diaphragm 4 and a microphone can easily be manufactured at a low cost.

For the fixation of the solid state device 8 and the casing 1, it is possible to use conductive adhesives, for example, conventional solders (lead tin based solders), brazes such as gold silicon (AuSi), gold tini (AuSn), gold germanium (AuGe), an epoxy based or polyimide based resin, silver glass and the like.

In the case in which the whole microphone is to be assembled at a time, the conductive adhesive of the low temperature curing type can be applied to the fixation of the solid state device 8 to the inside bottom part of the hollow portion of the casing 1.

What is claimed is:

1. An electret capacitor microphone comprising:
   a surface conductive diaphragm;
   a fixed electrode provided opposite to the diaphragm at a fixed interval; and
   a solid state device for converting a change in an electrostatic capacity between the diaphragm and the fixed electrode induced by a sound signal given to the diaphragm into an electric signal,
      wherein the electret capacitor microphone is provided with a dielectric casing defining a bottomed hollow portion for accommodating the diaphragm, the fixed electrode and the solid state device, and
      wherein a conductive path is applied to an outer surface of the dielectric casing, an upper surface of an opening of the dielectric casing is metallized, a spacer in contact with the diaphragm is provided on an inner surface, and the upper surface of the opening is bonded to a metal cover with a conductive adhesive, thereby electrically connecting the diaphragm and the conductive path.

2. The electret capacitor microphone according to claim 1, wherein the conductive adhesive has a curing temperature of 150° C. or less.

3. An electret capacitor microphone comprising:
   a surface conductive diaphragm;
   a fixed electrode provided opposite to the diaphragm at a fixed interval; and
   a solid state device for converting a change in an electrostatic capacity between the diaphragm and the fixed electrode induced by a sound signal given to the diaphragm into an electric signal,
      wherein the electret capacitor microphone is provided with a dielectric casing defining a bottomed hollow portion for accommodating the diaphragm, the fixed electrode and the solid state device, and
      wherein at least one conductive path connecting the diaphragm or the fixed electrode to the solid state device is applied to an inner surface of the dielectric casing and at least one pad electrode connected to the conductive path is provided on a bottom side of the casing.

4. The electret capacitor microphone according to claim 3, wherein the dielectric casing forms at least one stepped portion projecting into the hollow portion of the casing and the diaphragm or the fixed electrode is fixed into onto the stepped portion.

5. The electret capacitor microphone according to claim 3, wherein the hollow portion of the casing has a rectangular cross section.

6. The electret capacitor microphone according to claim 5, wherein an external shape of the casing has a rectangular cross section.

7. The electret capacitor microphone according to claim 3, wherein an opening of the hollow portion is covered with a metal cover through which a sound hole penetrates.

8. The electret capacitor microphone according to claim 7, wherein the cover is provided opposite to the diaphragm capable of being used as the fixed electrode.

9. The electret capacitor microphone according to claim 3, wherein a combination of the fixed electrode and the diaphragm is located on an opening side of the hollow portion and the solid state device is provided on a bottom side in the hollow portion of the dielectric casing.

10. The electret capacitor microphone according to claim 3, wherein the solid state device is provided in parallel to the combination of the fixed electrode and the diaphragm in one hollow portion of the dielectric casing.

11. The electret capacitor microphone according to claim 3, wherein the hollow portion and another hollow portion are provided in the casing in parallel, and the combination of the fixed electrode and the diaphragm and the solid state device are provided in each separate hollow portion, respectively.

12. The electret capacitor microphone according to claim 3, wherein the fixed electrode, the diaphragm and the solid state device are accommodated in the hollow portion of the dielectric casing, and a hole is provided on a wall part of the hollow portion in a position behind the diaphragm.

13. The electret capacitor microphone according to claim 12, wherein the hole is formed on an inside bottom portion of the hollow portion.

14. An electret capacitor microphone comprising:
a surface conductive diaphragm;
a fixed electrode provided opposite to the diaphragm at a fixed interval; and
a solid state device for converting a change in an electrostatic capacity between the diaphragm and the fixed electrode induced by a sound signal given to the diaphragm into an electric signal,
   wherein the electret capacitor microphone is provided with a dielectric casing defining a bottomed hollow portion for accommodating the diaphragm, the fixed electrode and the solid state device, and
   wherein at least one conductive path connecting the diaphragm and the fixed electrode is applied to an inner surface of the dielectric casing and at least one pad electrode connected to the conductive path is provided on a bottom side of the casing.

15. An electret capacitor microphone comprising:
a surface conductive diaphragm;
a fixed electrode provided opposite to the diaphragm at a fixed interval; and
a solid state device for converting a change in an electrostatic capacity between the diaphragm and the fixed electrode induced by a sound signal given to the diaphragm into an electric signal,
   wherein the electret capacitor microphone is provided with a dielectric casing defining a bottomed hollow portion for accommodating the diaphragm, the fixed electrode and the solid state device, and
   wherein at least one conductive path connecting the diaphragm or the fixed electrode to the solid state device is applied to an outer surface of the dielectric casing and at least one pad electrode connected to the conductive path is provided on a bottom side of the casing.

16. An electret capacitor microphone comprising:
a surface conductive diaphragm;
a fixed electrode provided opposite to the diaphragm at a fixed interval; and
a solid state device for converting a change in an electrostatic capacity between the diaphragm and the fixed electrode induced by a sound signal given to the diaphragm into an electric signal,
   wherein the electret capacitor microphone is provided with a dielectric casing defining a bottomed hollow portion for accommodating the diaphragm, the fixed electrode and the solid state device, and
   wherein at least one conductive path connecting the diaphragm and the fixed electrode is applied to an outer surface of the dielectric casing and at least one pad electrode connected to the conductive path is provided on a bottom side of the casing.

17. The electret capacitor microphone according to any of claims 3 to 16, wherein the pad electrode of the casing is bonded to a corresponding electrode on a printed circuit board with a conductive adhesive and is mounted on the printed circuit board.

\* \* \* \* \*